United States Patent [19]

Chandross et al.

[11] 3,993,485
[45] Nov. 23, 1976

[54] PHOTOPOLYMERIZATION PROCESS AND RELATED DEVICES

[75] Inventors: Edwin Arthur Chandross, Berkeley Heights; Walter John Tomlinson, III, Holmdel; Heinz Paul Weber, Middletown, all of N.J.

[73] Assignee: Bell Telephone Laboratories, Incorporated, Murray Hill, N.J.

[22] Filed: May 27, 1975

[21] Appl. No.: 580,929

[52] U.S. Cl. .............................. 96/27 H; 96/115 P; 96/35.1; 350/3.5
[51] Int. Cl.$^2$............................................. G03C 5/04
[58] Field of Search ............... 96/27 H, 35.1, 115 P; 350/3.5, 96 WG

[56] References Cited
UNITED STATES PATENTS

| | | | |
|---|---|---|---|
| 3,658,526 | 4/1972 | Haugh..................................... | 96/27 |
| 3,689,264 | 9/1972 | Chandross et al. .................... | 96/35.1 |
| 3,760,292 | 9/1973 | Kogelnik........................ | 331/94.5 C |
| 3,809,686 | 5/1974 | Chandross et al. ............. | 260/89.5 A |
| 3,809,732 | 5/1974 | Chandross et al. ..................... | 264/22 |

*Primary Examiner*—John D. Welsh
*Attorney, Agent, or Firm*—Wilford L. Wisner; Daniel D. Dubosky

[57] ABSTRACT

A photopolymerization process is adapted for the production of various optical devices by means of a modified process which serves to increase the index change obtainable in a variable pattern of index of refraction. The process comprises the steps of flowing into place in a supporting structure a mixture of two components of differing reactivity and polarizability, partially polymerizing the mixture, writing a pattern of varying index of refraction in the partially polymerized mixture by further polymerizing it by suitable optical radiation in a corresponding pattern, and fixing the mixture against subsequent changes in polymerization. Typical components used in the process include a mixture of the monomers cyclohexyl methacrylate and N-vinylcarbazole together with benzoin methyl ether as a photosensitive initiator of polymerization, which proceeds by free radical reactions. In the limit of our technique, one of the components can have zero reactivity. This photopolymerization process is applicable to production of volume gratings in closed cavities having parts with constricted clearances therebetween, in which application it is impossible to evaporate unreacted components after the mixture has been flowed into place. The volume gratings are useful in distributed feedback lasers, in frequency sensitive optical filters and in channel-dropping arrangements for optical communication systems. Submerging the apparatus in which polymerization is to occur in an index-matching fluid between flat glass plates is an aid to producing uniform volume gratings in a cylindrical device.

8 Claims, 13 Drawing Figures

PHOTOPOLYMERIZATION PROCESS AND RELATED DEVICES

BACKGROUND OF THE INVENTION

This invention relates to photopolymerization processes directed to the production of optical devices.

Since the advent of extensive research involving both analysis and experimental work on integrated optical devices and systems for communication and data processing, procedures for developing devices having a high resolution and index of modulation of a desired pattern of index of refraction have become increasingly desirable.

For example, the use of distributed feedback, sometimes called integrated feedback, in lasers is one use of such a pattern of index of refraction. Such a laser can be operated without the need for reflectors external to or applied at the ends of the optical gain medium. Other possible uses include frequency selective filters and related channel-dropping and channel-adding apparatuses.

Much prior work has been pursued with photosensitive monomers and polymers to produce desired density or index of refraction modulations in optical devices. The prior proposals which achieved the highest index modulation have employed polymers doped with a monomer or another photo-activated component. These materials are not suitable for use in a closed cavity, or in an elongated restricted space open only at the ends, because of the high viscosity of the initial polymer solution, or because they require the evaporation from the device of some unreacted monomer or other component. Furthermore, the prior photoinduced reactions typically result in a substantial shrinkage; and in a closed cavity with a constant volume this can lead to cracking or the formation of voids.

Other prior proposals have employed only monomers, which are of sufficiently low viscosity to flow into confined spaces, and which do not require the evaporation of unreacted components. However, with these materials the achievable modulation of refractive index is insufficient for many applications, and the shrinkage is such that they cannot be used in closed constant-volume cavities.

An example of such a closed constant-volume cavity is a distributed feedback laser in which the index pattern is in a thin layer between a central active medium and an outer tubular jacket. The central core and the jacket are preformed and spaced, and provide very great impediment to viscous flow because of their elongation and very small lateral spacings. Even if the ends are not sealed before the index pattern is written, the increasing viscosity of the material during polymerization would prevent shrinkage in the longitudinal direction (if such shrinkage could take place it would distort the desired index pattern), so that a substantially constant-volume process appears desirable to prevent cracking and formation of voids.

There are many other applications of photopolymerization in which similar problems of insufficient index change or void formation exist.

SUMMARY OF THE INVENTION

Our invention is based on our discovery that all of the foregoing problems can be solved by using a mixture of components of relatively low viscosity and differing reactivities and polarizabilities, appropriately positioning the unreacted mixture, partially polymerizing the mixture, imposing the desired index pattern on the mixture by an appropriate pattern of radiation, and, lastly, fixing the mixture to guard against subsequent degradation when used in the presence of radiation.

According to one feature of our invention, in the positioning step the mixture of low-viscosity unreacted components including at least one monomer is flowed into place, and the fixing step includes polymerizing all remaining portions of the monomer or monomers.

According to another feature of our invention, one or more of the components of the mixture are inert, that is, of zero reactivity, thus reducing the amount by which the mixture would shrink under unrestrained circumstances to the point where it can be used in closed constant-volume cavities without cracking or forming voids. For example, it is sufficient that a smooth surface of the mixture is maintained under slight shrinkage.

According to still other features of our invention, three specific examples employ mixtures, respectively, of a high-reactivity monomer, such as a methacrylate, with a lower reactivity monomer or inert ingredient. In one example, the higher reactivity component yields the higher polarizability; while in the other two cases the opposite is true.

BRIEF DESCRIPTION OF THE DRAWING

Further features and advantages of our invention will become apparent from the following detailed description taken together with the drawing in which.

DESCRIPTION OF ILLUSTRATIVE EMBODIMENTS

Figure 1:
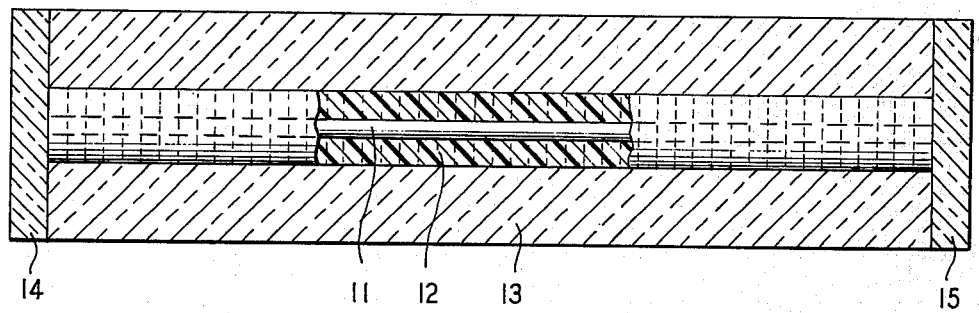
FIG. 1 is a pictorial sectional view of a distributed feedback laser made according to the invention.

The device of FIG. 1 is a distributed feedback laser including a neodymium-ion-doped core glass fiber 11, a surrounding polymer cladding 12 along which there is a periodic index of refraction variation from end to end, and an outer low index-glass cladding 13 which serves to protect the entire structure, to give it rigidity, to ensure guiding in the central portions 11 and 12, and also to support the end caps 14 and 15.

In using prior techniques for producing diffraction gratings by photoinduced polymerization or some other photosensitive response of polymers, one encounters various problems with the structure of FIG. 1. Those solutions of doped polymers which will give adequate variation of index of refraction not only are hard to flow in between the core 11 and the outer cladding 13, but in many cases they require the evaporation of a solvent after the materials have been flowed into place. While some monomers having low viscosity can readily be flowed into the restricted space, they do not produce sufficient index change. Undesirable shrinkage of the polymerized medium and formation of cracks and voids are also characteristic of those prior techniques and have made distributed feedback lasers of the type shown in FIG. 1 infeasible. For examples of such prior art, see the article by J. A. Jenney, *Journal of the Optical Society of America* 60, 1155 (1970); J. A. Jenney, *Journal of the Optical Society of America* 60, 724A (1970); J. A. Jenney, "Thick Photopolymer Holograms," Research Report No. 427, Hughes Research Laboratories, June, 1970, U.S. Pat. No. 3,479,185 to U. C. Chambers, and U.S. Pat. No. 3,658,526 to E. F. Haugh.

Our new process overcomes these difficulties. A new element of our process is the use of a mixture 12 of components having differing reactivities and, at least in their ultimate forms, differing polarizabilities. The latter properties distinguish it from processes employing single monomer systems and from prior mixtures of monomers. In FIG. 1, the mixture 12 is flowed into place between core element 11 and the capillary or jacket 13.

We have achieved index variations of the desired degree with a resolution providing at least 3600 lines per millimeter by the following steps.

An initial exposure destroys oxygen and other polymerization inhibitors, thus reducing the required exposure time to the subsequently used pattern of light. Because the initial polymerization tends to hold the mixture in place, it is merely optional to close the cavity between the initial polymerization and the final exposure to a pattern of coherent light. In most practical circumstances, as in FIG. 1, the cavity is effectively closed by the extremely extended, restricted nature of the space that the partially polymerized mixture of monomers has filled between element 11 and jacket 13.

When the mixture is irradiated with a periodic pattern of ultraviolet light, for example, in the case of the use of a mixture of N-vinylcarbazole and cyclohexyl methacrylate, further polymerization is initiated in the periodic regions upon which the light falls. Because the polymer has a higher density than the monomer, typically 10–15 percent, shrinkage would normally be expected to occur during polymerization. The polymer is formed preferentially from the higher reactivity monomer. Monomer is being depleted in the irradiated area, causing a concentration gradient that induces the monomer in the adjacent unaffected region to diffuse into the polymerizing region. This sort of diffusion mechanism has been previously explained for a single monomer system by W. S. Colburn et al in *Applied Optics* 10, 1636 (1971), and by R. H. Wopshall et al, in the *Journal of the Optical Society of America*, Vol. 61, page 649 (1971). In any event, the prior one-way diffusion mechanism is thought to be significant to the prior systems; but it is just one contributing factor to our invention, inasmuch as we provide a two-way diffusion, which is new.

Even if both monomers diffuse together in response to a concentration gradient the net effect is the same as if mainly the higher-reactivity one had diffused toward the high intensity region.

As the polymerization proceeds, the volume fraction of polymer in the high intensity areas increases; and the remaining monomer will tend to be excluded from these areas; that is, it now diffuses toward the regions of low light intensity. This diffusion is the second part of the two-way diffusion. Since the remaining monomer mixture has been enriched in the low reactivity monomer, the low light intensity areas will then contain an excess of low reactivity monomer, and the high intensity areas will contain a polymer with an excess of the high reactivity monomer. By this two-way diffusion, we achieve a modulation of the chemical composition of the final fully polymerized material. Since the final chemical constituents that provide this modulation have differing polarizabilities, the refractive index modulation resulting from this modulation of chemical composition tends to be much larger than that resulting from the density effect described above, and can predominate even if the two effects should be in opposite directions. That is, a relatively high polarizability gives the same effect on index of refraction as does relatively high density.

Subsequent overall exposure to the fixing light radiation then results in the polymerization in the low density region reaching its end point with lower density than that which the polymerization produced in the region of high light intensity during the generation of the periodic pattern. This single overall final exposure polymerizes all remaining monomers and acts as an image fixing step, yielding an inert composition, at least for the contemplated subsequent uses of the device.

It is necessary to postulate the occurrence of a two-way diffusion in order to explain the magnitude and sign of our observed refractive index changes. If the only diffusion were the one-way type found in single component systems (with or without a binder) then the only effect of the second component would be to change the index of the background material. This would not significantly alter the index change achievable by the selective polymerization of the high reactivity component. The large index changes found in our systems, and the signs of those changes, require that the second (less reactive) component be excluded from the regions where polymerization is first induced. Thus, there is a two-way diffusion.

EVALUATION OF INDEX MODULATION

To see how a variable composition resulting from the two-way diffusion affects the refractive index, we consider the general connection between molecular parameters and refractive index.

The index of refraction of a transparent material is related to its polarizability by the Lorentz-Lorenz relation, $$\frac{n^2 - 1}{n^2 + 2} = \frac{4}{3} \pi P, \quad (1)$$

where $n$ is the refractive index and $P$ is the optical polarizability per unit volume. The polarizability can be written in the form $$P = \frac{\rho N_o}{M} \alpha \qquad (2)$$

where $\rho$ is the density, $N_o$ is Avogradro's number, M is the molecular weight, and $\alpha$ is the molecular polarizability. Note that the factor $\rho N_o/M$ is the molecular density, so that the polarizability per unit volume is simply the product of the molecular polarizability and the molecular density. (In the case of polymers it is customary to consider each repeat unit as a separate molecule.) For an ideal mixture, the total polarizability is given by the sum of the form $$P = \Sigma N_i \alpha_i \qquad (3)$$

where $N_i$ is the molecular density of the i'th component of the mixture, and $\alpha_i$ is its molecular polarizability.

To apply the above expressions to photopolymer materials we assume that the hologram exposure, E, is of the form $$E = E_0 + E_1 \cos(kx), \qquad (4)$$

and that this produces a modulation of the final polymer of the form $$N_a = N_{a0} + N_{a1} \cos(kx), \qquad (5)$$

$$N_b = N_{b0} - N_{b1} \cos(kx), \qquad (6)$$

where $N_a$ and $N_b$ are the molecular densities of the high-reactivity and low-reactivity components respectively, and we have neglected any higher spatial harmonics of the molecular distributions. This will result in a modulation of the polarizability of the form $$P = P_0 + P_1 \cos(kx), \qquad (7)$$

where $$P_0 = N_{a0}\alpha_a + N_{b0}\alpha_b + N_c\alpha_c, \qquad (8)$$

$$P_1 = N_{a1}\alpha_a - N_{b1}\alpha_b. \qquad (9)$$

$N_c$ is the molecular density of the inert binder (if any), and the $\alpha$'s are the molecular polarizabilities of the various components.

For a conventional single monomer model, $N_b = 0$, so that the sign of $P_1$ is always positive. For out two-monomer model the sign of $P_1$ can be either positive or negative, depending on the relative sizes of the quantities $N_{a1}\alpha_a$ and $N_{b1}\alpha_b$. It might seem that the two monomer systems would result in a smaller modulation of the total polarizability because the modulations of $N_a$ and $N_b$ are 180° out-of-phase and hence tend to cancel. However, it appears that the two-way diffusion in the two-monomer systems can give considerably larger modulations of the molecular densities than could be sustained in the one-monomer systems. By choosing monomers with appreciably different $\alpha$'s it is then possible to achieve larger values of $P_1$ than have been reported for single-monomer systems. Although the same mechanisms as are involved in one-monomer systems will tend to make $N_a$ at least slightly larger than $N_b$, we expect that the sign of $P_1$ will be determined primarily by the relative sizes of $\alpha_a$ and $\alpha_b$. If the high reactivity monomer has the higher molecular polarizability ($\alpha_a > \alpha_b$) the sign of $P_1$ will tend to be positive, while $\alpha_a < \alpha_b$ will tend to result in $P_1$ being negative.

PHASE DIAGRAM INTERPRETATION OF TWO-MONOMER SYSTEMS

An alternate way of interpreting the mechanisms involved in the two-monomer model is in terms of phase equilibria. We are actually dealing with complex nonhomogeneous nonequilibrium systems, so we cannot expect quantitative results, but this approach does give some physical insight into the process.

The solubility of polymers in their monomers is frequently quite small, and this solubility decreases for increasing polymer chain length. A system represented by a point below its solubility curve will separate into two phases. The phases will have different polymer concentrations, but typically both phases will contain more solvent than polymer. If the solvent is a mixture of two different solvents, similar phenomena occur, but the two phases can differ markedly in their relative concentrations of the two solvents.

To describe our systems in these terms, we begin with a mixture of two solvents (the two monomers) and a polymer volume fraction of zero. We assume that polymerization is initiated in a grating pattern, thus in the bright fringes the polymer fraction will steadily increase. At the same time, the average chain length of the polymer is increasing so that the solubility is decreasing. At some point the system will become unstable, and will attempt to separate into two phases. Because the polymerization has been initiated in a grating pattern, the phase separation will become aligned with the fringes.

At the same time as the above processes are happening, the viscosity of the solution is steadily increasing. If, at the point when the system becomes unstable, the viscosity is not too high, substantial phase separation can occur and give a large spatial modulation of the chemical composition of the system. However, the viscosity must also be high enough to keep the pattern stable, and to prevent the formation of random scattering centers. If all these conditions are satisfied, the subsequent increase of the viscosity will "freeze in" the fringe pattern, and the final overall exposure will complete the process to give a photochemically inert material with a spatially modulated composition.

From this description it should be clear that the successful operation of the two-monomer systems involves a complex balance of effects, and that detailed predictions are likely to be difficult to achieve. However, the phase equilibrium concepts form a useful framework for discussing the effects of small changes in the system parameters. For example, if a given system shows random phase separation, it may be possible to eliminate this by increasing the intensity of the exposing light so as to increase the rate at which the system passes through the phase separation point.

It also may be advantageous that the second monomer polymerizes via an entirely different route than the first, e.g., an ionic or epoxy type reaction instead of a free radical or vinyl type reaction.

EXTENSION TO INERT COMPONENTS

In all of the above, we have used the terms "high-reactivity monomer" and "low-reactivity monomer" without putting any limits on their relative rates of reactivity.

In fact, none of our discussion is changed in the limit that the low-reactivity monomer has zero reactivity. The only requirement is that we have sufficient polymerizable material to produce a stable image. If the high-reactivity monomer is actually a mixture of two similar monomers, one of which leads to crosslinks in the polymer, it is possible to obtain stable images even with relatively large concentrations of inert material. Since a crosslinked polymer is less soluble than a linear polymer of the same material, the addition of crosslinking agents will also affect the rate of phase separation and of the increase of viscosity.

EXPERIMENTAL RESULTS

TWO POLYMERIZABLE COMPONENTS

The first two-component system we investigated used cyclohexyl methacrylate as the high-reactivity monomer and vinylcarbazole as the low-reactivity monomer. Typical proportions are those of Formula I in Table I. Both monomers polymerize by free radical reactions, with a reported reactivity ratio, under reasonably relevant conditions, of about 40. The refractive indices of the homopolymers are 1.505 for the acrylate, and 1.69 for the carbazole.

period of several weeks showed no sign of deterioration.

In addition to thin film gratings, we also wrote gratings in capillary tubes (i.d. 8–100 $\mu$m) filled with the mixture of Formula I. Such capillaries are effectively constant-volume cavities, and the shrinkage during polymerization resulted in random cracking and formation of voids.

LOWER-INDEX INERT COMPONENT

In the next system we investigated, represented by Formula II in Table I, a completely inert component (dimethyl suberate) was used as the "low-reactivity" monomer, and a small amount of bifunctional monomer was used to give a crosslinked polymer. The suberate has a refractive index $n_D = 1.4325$, so that in this system the high reactivity component, the methacrylate, has the higher polarizability and index of refraction.

From contact printed patterns we determined that for this system the refractive index is higher in areas which received more exposure, or that $P_1$ is positive. This is the opposite of that for Formula I, as predicted by our two-way diffusion model.

TABLE I

| Formula Number | Compound | Quantity | Function | $n_D$ |
| --- | --- | --- | --- | --- |
| I (Two Polymerizable Components) | Cyclohexyl methacrylate | 1.0 ml | High reactivity monomer | 1.505 |
|  | N-Vinylcarbazole | 0.3 gm | Low reactivity monomer | 1.69 |
|  | Benzoin methyl ether | 0.125 gm | Initiator | — |
| II (Lower Index Inert Component) | Cyclohexyl methacrylate | 1.0 ml | Monomer | 1.505 |
|  | Ethylene glycol dimethacrylate | 0.12 ml | Crosslinking monomer | — |
|  | Dimethyl suberate | 0.25 ml | Inert | 1.4325 |
|  | Benzoin methyl ether | 0.06 gm | Initiator | — |
| III (Higher Index Inert Component) | Butyl methacrylate | 0.5 ml | Monomer | — |
|  | Ethylene glycol dimethacrylate | 0.5 ml | Crosslinking monomer | — |
|  | 1-Phenylnaphalene | 0.5 ml | Inert | 1.666 |
|  | Benzoin methyl ether | 0.07 gm | Initiator | — |

By interference microscopy on contact printed patterns, we determined that the refractive index was higher in areas which received less exposure, or that $P_1$ is negative. A negative value of $P_1$ is consistent with our model of two-way diffusion or phase separation, and with the fact that the N-vinylcarbazole has the higher polarizability, and is opposite to that predicted by previous models for single-monomer systems.

We carried out a number of experiments, in which we wrote gratings in thin films of various mixtures, between two glass plates, to determine the proportions that give the largest index modulation. For exposure with an average intensity of 2.5 mW/cm$^2$ ($\lambda = 325$ nm) Formula I appeared to be about optimum. The optimum exposure time was about five minutes, or a total exposure of ~750 mJ/cm$^2$, and the preexposure was necessary for maximum index change. Gratings with 280 nm periods had index modulations with fractional amplitudes of up to $2\times10^{-3}$. (This is a peak-to-trough index difference of 0.4 per cent.) None of the foregoing parameters is critical to achievement of an appreciable index difference.

After the exposure was complete, the cover slide could be readily removed from the gratings, leaving a smooth hard surface. Even with gratings as thin as 5 $\mu$m, the transmitted first order beam was always much stronger than the reflected first order beam. This indicates that they are true volume gratings, with little or no thickness modulation. Gratings observed over a From efficiency measurements on thin-film gratings using the mixture of Formula II we determined that the fractional amplitude of the index modulation was about $2\times10^{-4}$. This is probably too small to be of practical use for many applications, but we did obtain some results of interest for understanding the mechanisms of such systems. If we reduced the concentration of the crosslinker, which is ethylene glycol dimethacrylate, to less than about half that of Formula II, we found we could still write gratings, but that they faded away in a few hours. This suggests that the suberate is too good a solvent for the polymer. If the suberate and the polymer are very compatible, we would not expect to get much phase separation, and this is consistent with the observed small index modulation. In fact, it may be that in this system the index modulation results primarily from diffusion of monomer into the high intensity areas, with the two-way diffusion with respect to the suberate only weakly modulating the concentration of this inert (non-polymerizable) component. While the mixture of Formula II has not been optimized, it should be clear that it employs the principles of the invention.

It is clear that many more systems can be conceived that will cause both the polarizability and density effects to be additive, and that use of components with a greater index difference than those described here would enhance the effect.

HIGHER-INDEX INERT COMPONENT

The third system we investigated used an inert component with a high refractive index (phenylnaphthalene, $n_D = 1.666$), as shown by Formula III in Table I. We found that we could get stable images, even when the inert component constituted more than one-half of the starting mixture, provided at least one-quarter of the monomer was bifunctional. It is with this system that we achieved the largest index modulations. The proportions and conditions for employing this system proved to be very tolerant of variations.

INITIAL TESTS

Initially, we tested each formula in a planar geometry (not shown). The space between a microscope slide and a cover slip of thin glass was filled with the monomer mixture by capillary action. In the more practical application of this step to the example of FIG. 1 the microscope slide would be replaced by the outer glass jacket 13 and the cover slips by the internal fiber 11 properly preformed.

In either geometry, the monomer mixture would then flow into the space by capillary action or be forced in under pressure.

After experimenting with gratings in thin films of a considerable number of different formulations, we found that Formula III gave the largest index change. Fractional modulation amplitudes of up to $7.8 \times 10^{-3}$ were achieved, considerably greater than the $6.7 \times 10^{-4}$ previously reported for systems which are initially liquid, and almost 50% greater than the $5.3 \times 10^{-3}$ reported, for $\lambda = 633$ nm, for the best system using a polymeric binder. From contact printed patterns we determined that the index is lowest in the areas which received the highest exposure, or that $P_1$ is negative, in agreement with our two-way diffusion model. With an average flux of $\sim 3$ mW/cm$^2$ at $\lambda = 325$ nm, typical exposure times were 5–15 minutes. (Similar results were achieved for gratings written at $\lambda = 364$ nm.) The pre- and post-exposure irradiations with the arc lamp were both desirable in these tests for maximum index modulation.

Figure 9:
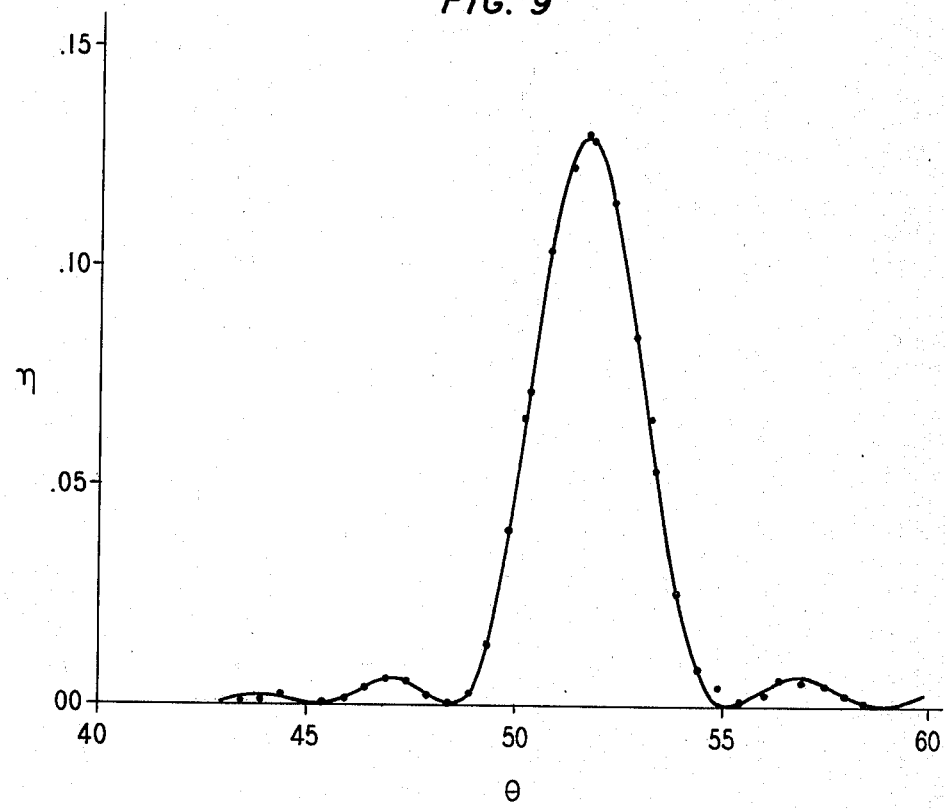
FIG. 9 shows a curve representing scattering efficiency near the Bragg angle in a thin-film grating made according to the invention.

In most cases, we found good agreement between the measured and calculated widths of the angular responses of the gratings. As an example, FIG. 9 shows a theoretical curve of scattering efficiency vs incidence angle, along with experimental data points. The excellent fit, especially in the side lobes, indicates that the grating is quite uniform throughout the thickness of the film. Even a small nonuniformity would have the effect of raising the minima of the response curve.

Although the mixture of Formula III gave the largest index modulation, similar results were obtained with mixtures in which some or all of the butyl methacrylate was replaced by cyclohexyl methacrylate, or for total monomer fractions varying from 0.3 to 0.7. It would appear that the solubilities of various methacrylate polymers in phenylnaphthalene are similar, and give rise to a significant phase separation at a concentration where the viscosity is appropriate for achieving a large stable modulation. We can get a rough estimate of the degree of chemical differentiation by comparing the observed index modulation to the maximum possible modulation. Assuming a refractive index of 1.50 for the pure polymers, complete differentiation of the polymer and the inert component would give an index difference of about 0.17 or a fractional modulation amplitude of about $5 \times 10^{-2}$. The experimentally observed amplitudes of over $7 \times 10^{-3}$ indicate that the concentrations of the polymer and of the inert component are probably modulated with fractional amplitudes in excess of 10%.

Figure 2A:
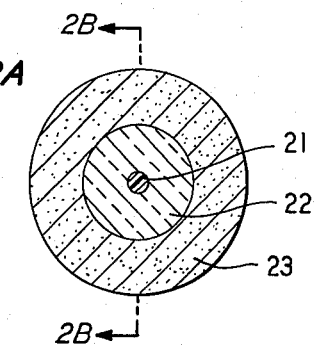
FIGS. 2A and 2B are orthogonal cross-sectional views of an optical filter made according to the invention.
Figure 2B:
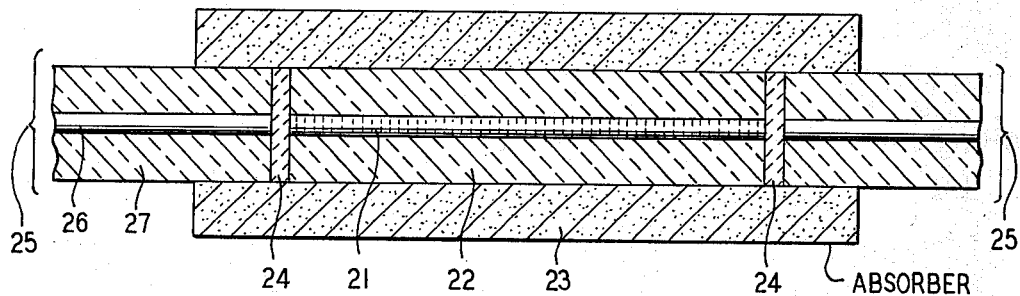

In FIGS. 2A and 2B there is shown another application of our invention, specifically an optical filter adapted for interconnection with an optical fiber system. The first version of the filter includes a grating like optical core 21 made according to the method of the invention, a dielectric jacket 22 and an absorbing body 23 for the filtered radiation that surrounds or substantially surrounds the jacket 22.

In the side view of FIG. 2B it may be seen that the assembly further includes a very thin layer of cement or epoxy 24 that bonds the filter assembly to the adjacent ends of the optical fiber transmission link 25 in which the filter is placed. In general the link 25 will include a relatively high-index core 26 and a relatively low-index cladding 27. The cement 24 will have an index typically intermediate these indices; and the mean index of photosensitive medium 21 will be near to that of core 26 of the optical link. The jacket 22 has an index of refraction near to that of cladding 27 of the optical link.

It will be noted that the absorber 23 in the illustrative embodiment extends beyond the junction of the filter assembly with the optical link 25 in order to provide greater rigidity and reliability of the interconnection.

When gratings were written in hollow fibers ($\sim 80$ $\mu$m i.d.) filled with the mixture of Formula III in Table I, the polymer pulled away from the tube walls, but the resulting surface was sufficiently smooth that light could still be guided in the polymer. To demonstrate the filtering action of such a grating we spliced a 5.25 mm long section of it ($\Lambda = 324$ nm) to a liquid core fiber, filled with phenylnaphthalene. Light from a tungsten "point source" was coupled into one end of the fiber using a lens with a numerical aperture of 0.2; and the output light from the other end was focused on the slit of a spectrometer. Because the response of the grating will be sharply peaked in angle, and because in such a highly multimode filter the light will propagate at many different angles, we do not expect to get complete extinction in the stop band of the grating. From theories for thick hologram gratings, we calculate that for plane wave excitation our filter would have a rather rectangular shaped stop band about 6 nm wide, and a peak attenuation of essentially 100 percent. The observed bandwidth of $\sim 20$ nm indicates that the angular spread of the light in the fiber is contributing a width of $\sim 19$ nm. This width corresponds to an angular range of 11° or a numercial aperture (n.a.) of 0.29. While the n.a. of the injected light beam was only 0.2, the fiber has an n.a. of over 0.7, and it is quite reasonable to expect some light to be scattered into higher order modes. For a basic filter bandwidth of $\sim 6$ nm, and an angular range corresponding to a bandwidth of 19 nm, we would expect a peak attenuation of about $6/19 \approx 30\%$, which is close to the observed value of 25%. In a single mode or a low n.a. fiber such gratings would have attenuations (reflectivities) close to 100%, and narrower bandwidths could be obtained by reducing the length of the grating or its amplitude.

We have also experimented with variations on Formula III in which the total monomer fraction was as low as 17%, and only 25% of the monomer was bifunctional. In constant volume cavities, like those of FIGS. 2A and 2B, such as 80 $\mu$m i.d. hollow fibers, stable gratings can be written in these materials without cracking or the formation of voids; but the achievable index changes were as much as a factor of 5 lower than for Formula III.

In both fiber and thin-film geometries, the weakly exposed regions at the edges of gratings written in these materials showed a slight haziness. This indicates that a certain amount of random phase separation has taken place, although grating scattering was still observable in these areas. Since there was little or no haziness at the centers of the gratings, where the intensity is highest, it seems likely that increasing the exposing intensity would eliminate the problem of random phase separation.

We feel these experiments demonstrate that multicomponent, two-way diffusion photopolymer systems can be successfully used in constant-volume cavities, although the material composition must be carefully selected, and the index changes will be somewhat smaller than can be achieved when some shrinkage can be tolerated.

Figure 3A:
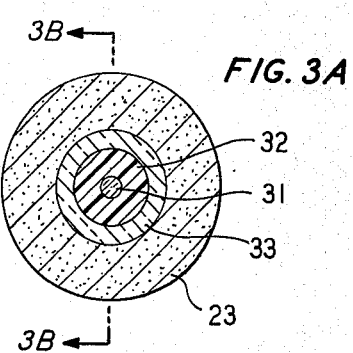
FIGS. 3A and 3B are orthogonal sectional views of a modified optical filter made according to the invention.
Figure 3B:
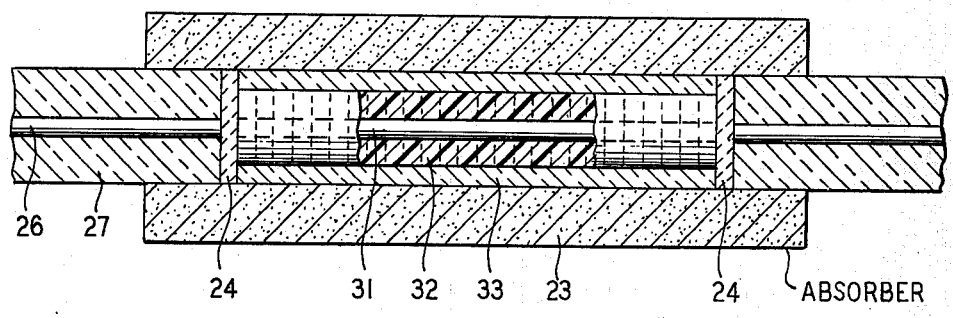

It is also possible to construct the filter in much the same way as the distributed feedback laser of FIG. 1. Such a filter is shown in FIGS. 3A and 3B. Here the core fiber 31 is a passive dielectric illustratively identical to the core 26 of the optical link in which the filter is placed. The photosensitive medium 32 made according to the invention is disposed around core 31 and is generally of lower index than the core; and the dielectric jacket 33 which surrounds it is generally of even lower index. The absorber 23 may be the same as in FIGS. 2A and 2B.

In the operation of the embodiments of FIGS. 2A, 2B, 3A and 3B, those frequencies are filtered out which have multiples of half-wavelengths sufficiently close to the spacing of the maxima or minima of the optical index of refraction variation in the photosensitive medium 22 or 32 for the respective embodiments. Once the energy is no longer guided in the central element or elements of the assemblies it is important that it be absorbed by absorber 23 before it can repropagate into the continuation of the optical fiber link 25. The illustrative structure achieves this result.

Figure 4A:
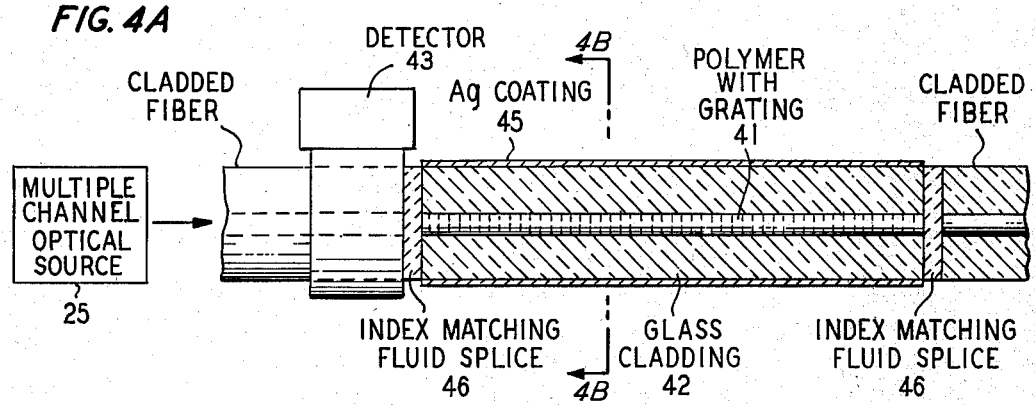
FIGS. 4A and 4B are orthogonal sectional views of a channel-dropping filter and detector made according to the invention.
Figure 4B:
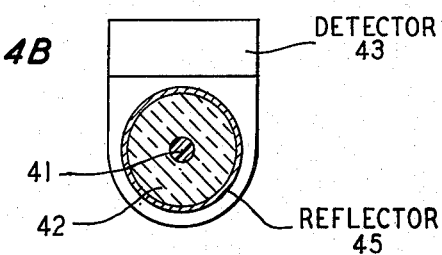

The filter embodiments of FIGS. 2A, 2B, 3A and 3B may be modified as shown in FIGS. 4A and 4B to be an optical detector or receiver simply by placing a detector 43 at one boundary of the filter assembly, for example, at one boundary or limit of the low-index dielectric jacket 42. The photosensitive medium 41 with the grating effect therein is the frequency-selective filter element in this embodiment, as in FIGS. 2A and 2B. That medium is the polymer 41. To increase the efficiency of this assembly as a detector for a selected band or wavelength from the entire range of wavelengths propagating in the fiber link 25, the jacket 42 is surrounded by a reflective coating 45, illustratively a silver coating, to insure that the abstracted wave energy from the fiber link eventually arrives at detector 43 in FIG. 4A. It is assumed that the optical energy is propagating from left to right. The detected light is the back-scattered light from grating 41. The reflector 45 may be extended around the fiber link 25 including core 26 and cladding 27 to improve the coupling to detector 43. In that event an index matching fluid 46 is placed between reflector 45 and cladding 27.

Figure 5A:
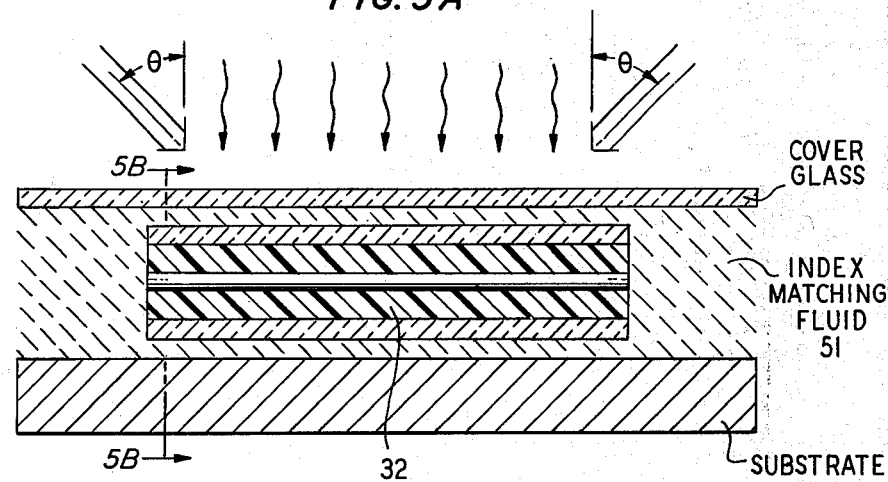
FIGS. 5A and 5B are orthogonal sectional views of a typical device in a typical fabrication environment at successive steps of the process according to the invention.
Figure 5B:
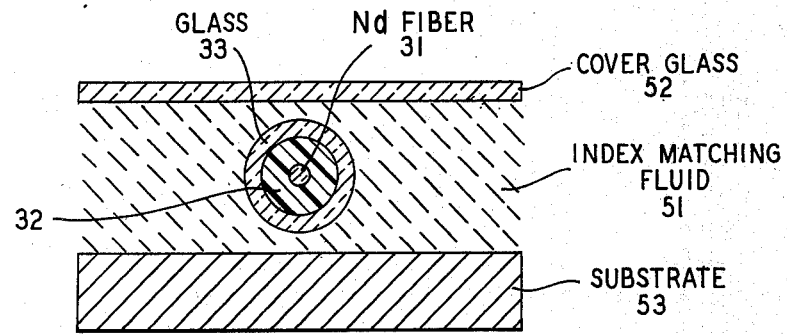

In order best to expose the materials in a cylindrical geometry, it is advantageous to insert the parts in an index matching fluid 51 between the flat glass plates 52 and 53, as shown in FIGS. 5A and 5B.

As shown in FIG. 5A, two coherent optical beams, illustratively derived from the same laser, as for example, a cadmium ion laser at 3250 A (Angstrom units), may be directed at an appropriate angle 20 with respect to each other to form the interference pattern in the photosensitive medium 32 which comprises a mixture of components of the types disclosed hereinbefore.

Various modifications of the foregoing embodiments can be readily achieved. In the fiber laser, the pump light can be guided either in the central core or in the core and the intermediate coating immediately surrounding the core; and the indices of refraction would be accordingly appropriately chosen. The latter alternative may be desired in order to avoid a requirement for a coherent pump source. When using such larger diameter highly multimode guiding, one will observe that the absorption coefficient for the pump light is then larger by approximately the amount of the area ratio of the polymer and the core, assuming that all the active ions are in the core. Nevertheless, with the new high concentration neodymium-ion compounds, this modification will still give realistic absorption distances. For example, a neodymium pentaphosphate crystal having a bulk absorption length $\alpha = 100$ micrometer at 8000 A and a diameter of about 5 $\mu$m in a polymer cladding of diameter 50 $\mu$m has an absorption length of 1 cm. This is a reasonable length for such a crystal, for use in a modification of the embodiment of FIG. 1.

The pumplight in modes with large amplitudes in the core will pump the laser most efficiently. To utilize the pumplight in modes which do not appreciably penetrate the core, it is necessary to have some mode mixing mechanism. If naturally occurring perturbations of the polymer guide are insufficient, one can easily introduce mode mixing by corrugating the inner surface of the cladding. This modification of FIG. 1 will not affect the losses for the laser light guided in the core.

This latter laser configuration brings the illumination of the entire pumplight into a small cross section and results not only in a large gain but also in a lower threshold. The 100 $\mu$W range for laser threshold by LED pumping does not seem unreasonable for a 1 cm long laser.

In addition to the grating's effect on the evanescent field of the laser fiber of FIG. 1 or similar embodiments, we must also consider its effect on the pumplight. The grating will typically scatter pumplight into the cladding (or into the air), but we expect this effect to be relatively weak. For the guided laser light we have essentially a thick Bragg grating used at resonance; hence its efficiency varies as the square of its length. For the pumplight we are far from the Bragg condition and, because of the limited extent of the grating transverse to the fiber axis, the pump loss will vary linearly with length. A grating designed for a 1.06 $\mu$m laser with a 0.8 $\mu$m pump, and with an amplitude $a = 2 \times 10^{-3}$, would produce a pump loss of less than 0.1 dB/cm.

Figure 6:
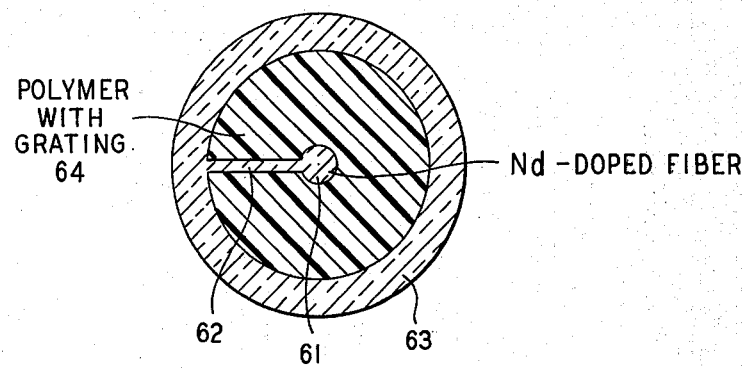
FIG. 6 shows a cross-sectional view of a modification of the embodiment of FIG. 1 using a so-called single-material fiber.

The invention may also be used with the new "single material fiber" geometry, as shown in FIG. 6, which is representative of prior single material fiber disclosures. For example, see U.S. Pat. application, Ser. No. 546,293, filed Feb. 3, 1975, now Reissued U.S. Pat. No. 28,664, for S. E. Miller and assigned to the assignee hereof. The device of FIG. 6 is distinctive in that the central fiber member 61 is neodymium-doped while the supporting plate 62 is undoped but otherwise of the same glassy material. The same is also true of the jacket 63. That is, it is undoped and of the same basic material as element 61 and 62; but it has much larger transverse dimensions than plate 62 and its thickness is also typically greater than the diameters of fiber 61. In this case the polymer 64 which includes the grating like variations in index of refraction along the axis of fiber 61 does not completely surround fiber 61. Plate 62 could also extend completely across jacket 63. In all other respects, the embodiment of FIG. 6 may be made and used in substantially the same way as any of the preceding embodiments.

Figure 7:
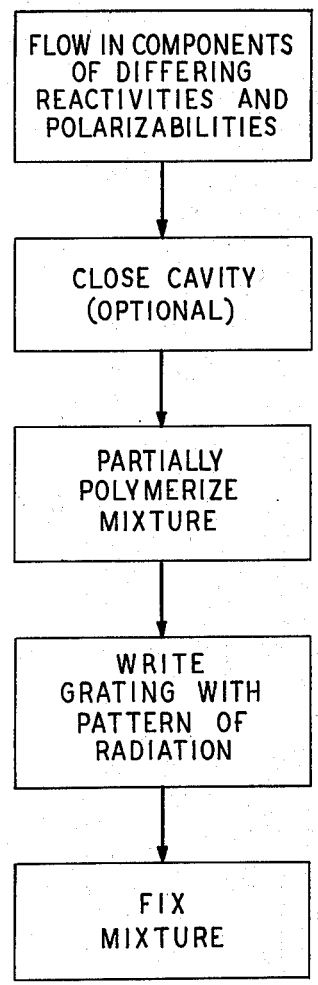
FIG. 7 shows a typical flow chart for the process of the invention.

FIG. 7 summarizes the inventive process of the present invention in a flow diagram. First, the two monomers or a mixture of components of distinctly different reactivities and polarizabilities are flowed into the restricted space. If that space is not otherwise sufficiently restricted to avoid loss of material, for example, if it does not provide capillary action, the ends of the space may be closed off to form a closed cavity. The mixture is then partially polymerized to hold the entire assembly together and to provide for the ultimately desired optical resolution. The grating or other index of refraction pattern is written with an appropriate corresponding pattern of radiation; and then any remaining monomers are fully polymerized to fix the mixture. Such polymerization will typically be achieved by a final optical exposure of suitable radiation but could also include other means such as heating to achieve the final polymerization.

Figure 8:
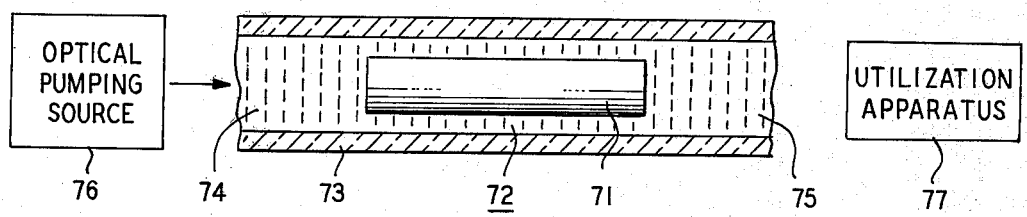
FIG. 8 is a pictorial sectional view of a waveguide-type laser having separate reflective elements employing the invention.

The embodiment of FIG. 8 is a waveguide laser that differs from the embodiment of FIG. 1 in that positive feedback for producing laser oscillation is provided by separate reflective elements 74 and 75 formed in a mixture 72 of components according to our invention. The active medium is a central element 71 of higher index than jacket 73 and can be like element 11 of FIG. 1.

Advantageously, the average index of the fully exposed mixture 72, including portions 74 and 75, may be matched to the index of element 71.

The index perturbations in elements 74 and 75 are sufficient to provide reflection if they are spaced at a half-wavelength in the medium 72 of the laser transition of element 71. Element 71 is illustratively crystal or glass body containing neodymium ions. Pumping source 76 is then radiated at 8000 A to pump the laser. Output radiation at 1.05 $\mu$m to 1.07 $\mu$m is obtained at apparatus 77.

The systems we have investigated are all variations on three basic formulas listed in Table I, and all of the components are commercially available. Before use, the liquid monomers were distilled or washed with alkali to remove inhibitors; and the vinylcarbazole of Formula I was recrystallized. The other materials were used as obtained. It is important that the benzoin methyl ether be pure enough to appear colorless. If necessary, the yellow decomposition products can be removed by recrystallization.

Thin-film samples were prepared by simply using capillary action to draw the liquid starting material into a space between a microscope slide and a cover glass. This technique gave films with thicknesses in the range of 4–25 $\mu$m. A few thicker films were prepared by depositing a small drop of the starting material on a slide and placing a cover slide on top of it. For experiments with quasi-constant volume cavities we used capillary action to fill hollow fibers (8–100 $\mu$m inside diameter) with the starting materials.

Samples were usually given a brief uniform preexposure, using a Xe-Hg arc lamp. The beam from a 1 kW arc was focused to a 4 cm diameter spot with f/1.5 optics, and samples were exposed to this beam for 5–10 seconds. The preexposure reduces the required grating exposure, by using up dissolved oxygen and any other polymerization inhibitors. It probably also forms a small amount of polymer, which increases the viscosity of the material and aids in stable image formation.

Gratings were written by using a He-Cd$^+$ laser ($\lambda$ = 325 nm) or an Ar$^+$ laser ($\lambda$ = 364 nm) and an interferometer to produce a high-contrast interference pattern with the desired fringe spacing. Typically the interferometer was set for a period of ~400 nm, but we have written gratings with periods as small as 280 nm. The gratings were about 1 cm in diameter, and exposure times of up to 15 minutes were used.

Following the grating exposure, the samples were given a second overall exposure with the arc lamp source, typically for 2–15 minutes.

For determinations of the sign of the photoinduced refractive index modulation, we made contact prints of a fine metal mesh (80 $\mu$m×80 $\mu$m holes on 100 $\mu$m centers) on the same type samples as were used for gratings. The pre- and post-exposures were the same as for gratings. The mesh exposure was also made with the arc lamp, but through an $n_D$ 1.0 filter so as to give an effective intensity similar to that used for the gratings. The mesh was placed on top of the cover slide, and held flat by a quartz slide. Exposure times were about 10 minutes. The completed samples were then examined with a Leitz transmission interference microscope to determine the relative optical thicknesses of the exposed and masked regions.

The amplitudes of the index modulations in the gratings were determined from measurements of their scattering efficiencies at $\lambda$ = 633 nm (transmitted first order). The gratings were mounted on a precision turntable so that in addition to measuring the peak scattering efficiency, we could also measure the absolute incidence angles for peak efficiency, half-peak efficiency and autocollimation. To eliminate complications from multiple reflections within the gratings, the back of the substrate was index-matched to a 1 cm thick transparent slab so as to produce a large displacement of the reflected beams. After the efficiencies were measured, the cover slides were removed, and the absolute thicknesses determined by interference microscopy at the edge of a small hole scraped in the film in the center of the grating region.

The amplitude of the index modulation was then determined by a computer fit to all the above data using known theoretical expressions corrected for refraction and reflection losses at the air-dielectric interfaces. The only adjustable parameters are the modulation amplitude and the tilt of the fringes, neither of which has much influence on the width of the curve of efficiency versus incidence angle. The calculated widths were in excellent agreement with the experimental values, indicating that the gratings are quite uniform throughout the thickness of the film.

What is claimed is:

1. A process comprising the steps of positioning in a supporting structure a mixture of at least two components of respectively differing photopolymerization reactivities and respectively differing optical polarizabilities, partially polymerizing the mixture, writing a pattern in the partially polymerized mixture by exposing it to optical radiation in a corresponding pattern and of a wavelength suitable for the photopolymerization, and fixing the mixture against the subsequent changes in polymerization.

2. A process according to claim 1 in which the positioning step comprises positioning a mixture of at least two components, a first component of which mixture is a monomer having a relatively high photopolymerization reactivity and a relatively high optical polarizability in the polymerized state, and a second component of the mixture is characterized by a substantially lower photopolymerization reactivity than said first component and a substantially lower optical polarizability than said first component, the writing step inducing a two-way diffusion of said components in the presence of the pattern of optical radiation, the writing step being continued long enough to promote diffusions of substantial portions of unpolymerized monomer from the low intensity light regions toward the high intensity light regions where they are subsequently polymerized and to induce diffusion of the second less reactive component from the high intensity light regions toward the low intensity light regions, the fixing step subsequently stabilizing the results of said two-way diffusion.

3. A process according to claim 1 in which the positioning step comprises positioning a mixture of at least two components, a first component of which mixture is a monomer having a relatively high photopolymerization reactivity and a relatively low optical polarizability in the polymerized state, a second component of which mixture is characterized by a substantially lower photopolymerization reactivity than said first component and a substantially higher optical polarizability than the polymerized form of said first component, said writing step being continued long enough to promote a diffusion of the unpolymerized monomer of said first component into regions of relatively high optical radiation intensity from regions of relatively low optical radiation intensity and to promote diffusion of the second component from the regions of relatively high optical radiation intensity toward the regions of relatively low optical radiation intensity, whereby the regions of the highest index of refraction coincide with the regions of relatively lowest optical radiation intensity during the writing step, the fixing step subsequently stabilizing the results of said two-way diffusion.

4. A process according to claim 1 in which the second component of the mixture has essentially negligible photopolymerization reactivity, and the fixing step polymerizes sufficient residual monomer portions of the first component about the concentrations of said second component to maintain the latter in their positions attained during the writing step.

5. A process according to claim 1 in which the two components of the mixture are initially substantially liquid components, the positioning step comprising flowing said components into position in a relatively restricted space of the supporting structure, the initial polymerizing step comprises increasing the viscosity of the mixture sufficiently to prevent flow of said mixture from said restricted space, the writing step promotes the two-way diffusion of the components from distances on the order no greater than the smallest dimension to be resolved in the pattern, and the fixing step includes photopolymerizing at least one component of the mixture to produce a solid matrix of both components retaining the results of the two-way diffusion of the writing step.

6. A process comprising mixing cyclohexyl methacrylate and a substantially comparable molecular proportion of N-vinylcarbazole and a substantially smaller proportion of benzoin methyl ether as a photosensitive initiator, flowing said mixture into position in a supporting structure, initially photopolymerizing partially to increase its viscosity to prevent flow along said supporting structure, writing a pattern of index of refraction into said mixture by exposing it to optical radiation adapted to promote further polymerizing of the cyclohexyl methacrylate, whereby a two-way diffusion of the monomer cyclohexyl methacrylate and N-vinylcarbazole occur, said methacrylate toward regions of highest optical intensity and said N-vinylcarbazole toward regions of lowest optical intensity, and fixing the patterns resulting from the two-way diffusion by a final exposure to uniform optical radiation selected to complete the polymerization of said mixture.

7. A process comprising mixing cyclohexyl methacrylate with a substantial but lesser portion of dimethyl suberate and still lesser proportions of ethylene glycol dimethacrylate and benzoin methyl ether as crosslinking monomer and photopolymerization initiator respectively, flowing said mixture into position in a supporting structure, initially the polymerizing of said mixture to increase its velocity and prevent flow along said supporting structure, writing a pattern of index of refraction into said mixture by exposing it to optical radiation selected to polymerize the polymerizable portions of said mixture whereby a two-way diffusion of the cyclohexyl methacrylate and dimethyl suberate is promoted, the former toward the regions of highest radiation intensity and the latter away from regions of highest radiation intensity, and fixing the mixture to preserve the index of refraction pattern resulting from the two-way diffusion by exposing it to optical radiation selected to complete the photopolymerization of the mixture.

8. A process comprising the steps of mixing butyl methacrylate with a substantially comparable molecular proportion of ethylene glycol dimethacrylate as a crosslinking monomer and 1-phenylnaphthalene as a liquid optical inert ingredient of relatively low viscosity and a substantially lesser proportion of benzoin methyl ether as a photosensitive polymerizing initiator, flowing said mixture into place in a supporting structure, initially photopolymerizing said mixture to increase its viscosity to prevent its flow along said supporting structure, writing an index of refraction pattern in said mixture by exposing it to a pattern of optical radiation selected to photopolymerize the monomer portion of butyl methacrylate and ethylene glycol dimethacrylate, thereby promoting a diffusion of the methacrylates toward the regions of highest optical radiation intensity and a diffusion of the 1-phenylnaphthalene away from the regions of highest optical intensity, and fixing the index of refraction pattern resulting from the two-way diffusion of exposing the mixture to optical radiation selected to complete the photopolymerization.

\* \* \* \* \*